United States Patent
David et al.

(10) Patent No.: US 10,408,892 B2
(45) Date of Patent: Sep. 10, 2019

(54) MAGNET WITH OPPOSING DIRECTIONS OF MAGNETIZATION FOR A MAGNETIC SENSOR

(71) Applicant: Allegro MicroSystems, LLC, Manchester, NH (US)

(72) Inventors: Paul David, Bow, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 13/946,010

(22) Filed: Jul. 19, 2013

(65) Prior Publication Data

US 2015/0022197 A1    Jan. 22, 2015

(51) Int. Cl.
- G01R 33/07 (2006.01)
- G01R 33/02 (2006.01)
- G01D 5/14 (2006.01)

(52) U.S. Cl.
CPC ............ G01R 33/07 (2013.01); G01D 5/147 (2013.01); G01R 33/02 (2013.01)

(58) Field of Classification Search
CPC ......... G01B 7/023; G01B 7/001; G01P 3/488; G01R 33/07; G01V 3/08; G01D 5/147; H03K 17/9517
USPC ...... 324/207.11–207.26, 228, 232, 251–253, 324/259, 260
See application file for complete search history.

(56) References Cited

U.S. PATENT DOCUMENTS

| | | | |
|---|---|---|---|
| 4,967,153 A | 10/1990 | Langley | |
| 5,128,613 A * | 7/1992 | Takahashi | B82Y 15/00 324/225 |
| 5,229,715 A | 7/1993 | Niino et al. | |
| 5,243,941 A * | 9/1993 | Hisanaga | F02D 31/004 123/339.13 |
| 5,581,179 A * | 12/1996 | Engel | G01D 5/147 174/556 |
| 5,781,005 A | 7/1998 | Vig et al. | |
| 5,963,028 A * | 10/1999 | Engel | G01R 33/07 174/536 |
| 6,043,646 A | 3/2000 | Jansseune | |
| 6,265,865 B1 | 7/2001 | Engel et al. | |

(Continued)

FOREIGN PATENT DOCUMENTS

| DE | 196 22 561 A1 | 12/1996 |
|---|---|---|
| DE | 19622561 | 12/1996 |

(Continued)

OTHER PUBLICATIONS

English Machine Translation Harumi et al. JP 08178937.*

(Continued)

*Primary Examiner* — Lee E Rodak
(74) *Attorney, Agent, or Firm* — Daly, Crowley, Mofford & Durkee, LLP (57) ABSTRACT

In one aspect, a magnetic field sensor is configured to detect a ferromagnetic object. The magnetic field sensor includes a magnet that includes two North regions and two South regions configured to generate opposing directions of magnetization to form a magnetic flux. The magnetic field sensor also includes a magnetic field sensing element configured to generate an is output signal responsive to changes in the magnetic flux caused by movement of the ferromagnetic object.

9 Claims, 7 Drawing Sheets

(56) References Cited

U.S. PATENT DOCUMENTS

| | | |
|---|---|---|
| 6,278,269 B1 | 8/2001 | Vig et al. |
| 6,692,676 B1 | 2/2004 | Vig et al. |
| 6,727,689 B1 * | 4/2004 | Furlong ............... G01D 5/2448 324/166 |
| 6,967,477 B1 * | 11/2005 | Murdock ............... G01D 5/145 324/207.25 |
| 7,112,955 B2 | 9/2006 | Buchhold |
| 7,112,957 B2 | 9/2006 | Bicking |
| 7,362,094 B2 * | 4/2008 | Voisine ................. G01D 5/247 324/173 |
| 7,385,394 B2 | 6/2008 | Auburger et al. |
| 7,492,149 B2 * | 2/2009 | Motz ..................... G01D 5/147 324/207.12 |
| 7,839,141 B2 | 11/2010 | Werth et al. |
| 7,956,604 B2 | 6/2011 | Ausserlechner |
| 8,058,870 B2 | 11/2011 | Sterling |
| 8,080,993 B2 | 12/2011 | Theuss et al. |
| 8,106,654 B2 | 1/2012 | Theuss et al. |
| 8,253,210 B2 | 8/2012 | Theuss et al. |
| 8,362,579 B2 | 1/2013 | Theuss et al. |
| 8,610,430 B2 | 12/2013 | Werth et al. |
| 8,773,124 B2 | 7/2014 | Ausserlechner |
| 9,116,018 B2 | 8/2015 | Frachon |
| 9,164,156 B2 | 10/2015 | Elian et al. |
| 9,201,123 B2 | 12/2015 | Elian et al. |
| 2004/0070390 A1 * | 4/2004 | Lamb et al. ............. 324/207.21 |
| 2005/0017709 A1 * | 1/2005 | Stolfus ................... F01D 17/06 324/174 |
| 2011/0127998 A1 | 6/2011 | Elian et al. |
| 2011/0267040 A1 | 11/2011 | Frachon |
| 2011/0291650 A1 * | 12/2011 | Franke .................. G01D 5/145 324/251 |
| 2013/0127457 A1 * | 5/2013 | Musha .................. B82Y 25/00 324/252 |
| 2013/0278246 A1 | 10/2013 | Stegerer et al. |

FOREIGN PATENT DOCUMENTS

| | | | |
|---|---|---|---|
| DE | 196 47 320 A1 | | 12/1997 |
| EP | 2 339 362 A1 | | 6/2011 |
| JP | 58015113 | | 1/1983 |
| JP | 07004971 | | 1/1995 |
| JP | 08178937 A | * | 7/1996 |
| JP | H08-178937 A | | 7/1996 |
| JP | H08178937 A | | 7/1996 |

OTHER PUBLICATIONS

Notification of Transmittal of the International Search Report and the Written Opinion of the International Searching Authority, or the Declaration; PCT-US2014/046114; dated Oct. 21, 2014; 12 Pages.
Volunary Amendment with English Claims dated Nov. 7, 2016 for Korean App. No. 10-2016-7004178; 15 Pages.
European Examination Report dated Jun. 20, 2017 for European Application No. 14747454.8-1568; 7 Pages.
Response to Communication Pursuant to Article 94(3) EPC dated Jun. 20, 2017 for European Application No. 14747454.8; Response filed Oct. 27, 2017; 7 pages.
Summons to attend Oral Proceedings dated Mar. 23, 2018 for EP Pat. Appl. No. 14747454.8; 7 pages.
Claims now on file as of Mar. 23, 2018 for EP Pat. Appl. No. 14747454.8; 2 pages.
Response to Final Office Action dated Jun. 15, 2018 for U.S. Appl. No. 13/946,417, filed Sep. 14, 2018; 15 Pages.
A.A. Thornton in reply to EPO Summons filed on Dec. 5, 2018 for EP Pat. Appl. No. 14747454,8; 7 pages.
Amended Claims in reply to EPO Summons filed on Dec. 5, 2018 for EP Pat. Appl. No. 14747454.8; 4 pages.
Minutes of the Oral Proceedings dated Feb. 1, 2019 for EP Pat. Appl. No. 14747454.8; 4 pages.
Decision to Refuse EP Pat Application No. 14747454.8 dated Feb. 7, 2019; 12 pages.
PCT International Preliminary Report dated Jan. 19, 2016 corresponding to International Application No. PCT/US2014/046114; 8 Pages.
EPO Communication Pursuant to Rules 161(1) and 162 EPC dated Feb. 24, 2016 corresponding to European Application No. 14747454. 8; 2 Pages.
Response (with amended Claims & Specification) to Official Communication Pursuant to Rules 161(1) and 162 EPC dated Feb. 24, 2016 for European Application No. 14747454.8; Response filed Aug. 2, 2016; 12 Pages.

* cited by examiner

PRIOR ART

MAGNET WITH OPPOSING DIRECTIONS OF MAGNETIZATION FOR A MAGNETIC SENSOR

BACKGROUND

Various types of magnetic field sensing elements are known, including Hall effect elements and magnetoresistance elements. Magnetic field sensors generally include a magnetic field sensing element and other electronic components. Some magnetic field sensors also include a fixed permanent magnet.

Magnetic field sensors provide an electrical signal representative of a sensed magnetic field, or, in come embodiments, fluctuations of the magnetic field associated with the magnet. In the presence of a moving ferromagnetic object, the magnetic field signal sensed by the magnetic field sensor varies in accordance with a shape or profile of the moving ferromagnetic object.

Magnetic field sensors are often used to detect movement of features of a ferromagnetic gear, such a gear tooth and/or gear slots. A magnetic field sensor in this application is commonly referred to as a "gear tooth" sensor.

In some arrangements, the gear is placed upon a target object, for example, a camshaft in an engine, thus it is the rotation of the target object (e.g., camshaft) that is sensed by detection of the moving features of the gear. Gear tooth sensors are used, for example in automotive applications to provide information to an engine control processor for ignition timing control, fuel management, wheel speed and other operations.

SUMMARY

In one aspect, a magnetic field sensor is configured to detect a ferromagnetic object. The magnetic field sensor includes a magnet that includes two North regions and two South regions configured to generate opposing directions of magnetization to form a magnetic flux. The magnetic field sensor also includes a magnetic field sensing element configured to generate an output signal responsive to changes in the magnetic flux caused by movement of the ferromagnetic object.

In another aspect, a magnetic field sensor is configured to detect a tooth on a wheel. The magnetic field sensor includes a magnet that includes at least two North regions and two South regions and is configured to generate opposing directions of magnetization to form a magnetic field. At least one face of the magnet has one of the two North regions and one of the two South regions. The magnetic field sensor also includes a magnetic field sensing element that includes a Hall element configured to sense magnetic flux changes not parallel to a surface of the magnetic field sensing element. The magnetic field sensing element is configured to generate an output signal responsive to changes in the magnetic field caused by movement of the tooth that includes a ferrous material. The magnetic field sensing element is disposed between the magnet and a point where the tooth moves closest to the magnet.

DESCRIPTION OF THE DRAWINGS

The foregoing features of the invention, as well as the invention itself may be more fully understood from the following detailed description of the drawings, in which.

DETAIL DESCRIPTION

Described herein is new magnet sensor configuration using a permanent magnet having opposing magnetic fields in opposite directions. The new magnet sensor configuration increases a sensor sensitivity to better detect changes in a magnetic field.

Before describing the present invention, some introductory concepts and terminology are explained. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

A "circular vertical Hall" (CVH) sensing element, which includes a plurality of vertical magnetic field sending elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element includes a circular arrangement of vertical Hall elements arranged over a common circular implant region in a substrate. The CVH sensing element can be used to sense a direction (and optionally a strength) of a magnetic field in a plan of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sending element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

While a Planar Hall element is described in examples below, it should be appreciated that the same or similar techniques and circuits apply to any type of magnetic field sending elements.

A "true power on state" (TPOS) detector as used in an automobile is described below. However, it should be apparent that the same techniques and similar circuits can be used with any type of magnetic field sensor used in any application.

Examples below describe a particular TPOS cam as may be used upon an engine camshaft target object. However, similar circuits and techniques can be used with other cams or gears disposed upon the engine camshaft, or upon other rotating parts of an engine (e.g., crank shaft, transmission hear, anti-lock braking system (ABS)), or upon rotating parts of a device that is not an engine.

As used herein, the phase "area of maximum field activity" is used to describe a region in space for which a magnetic field is most influenced in angle and/or magnitude by proximity of a soft ferromagnetic material (or high permeability material, where high means it sufficiently reduces the reluctance path of the magnetic flux for a given application) object. In other examples, a rotating target can be a hard ferromagnetic material for use in a wheel speed sensor, for example.

Figure 1:
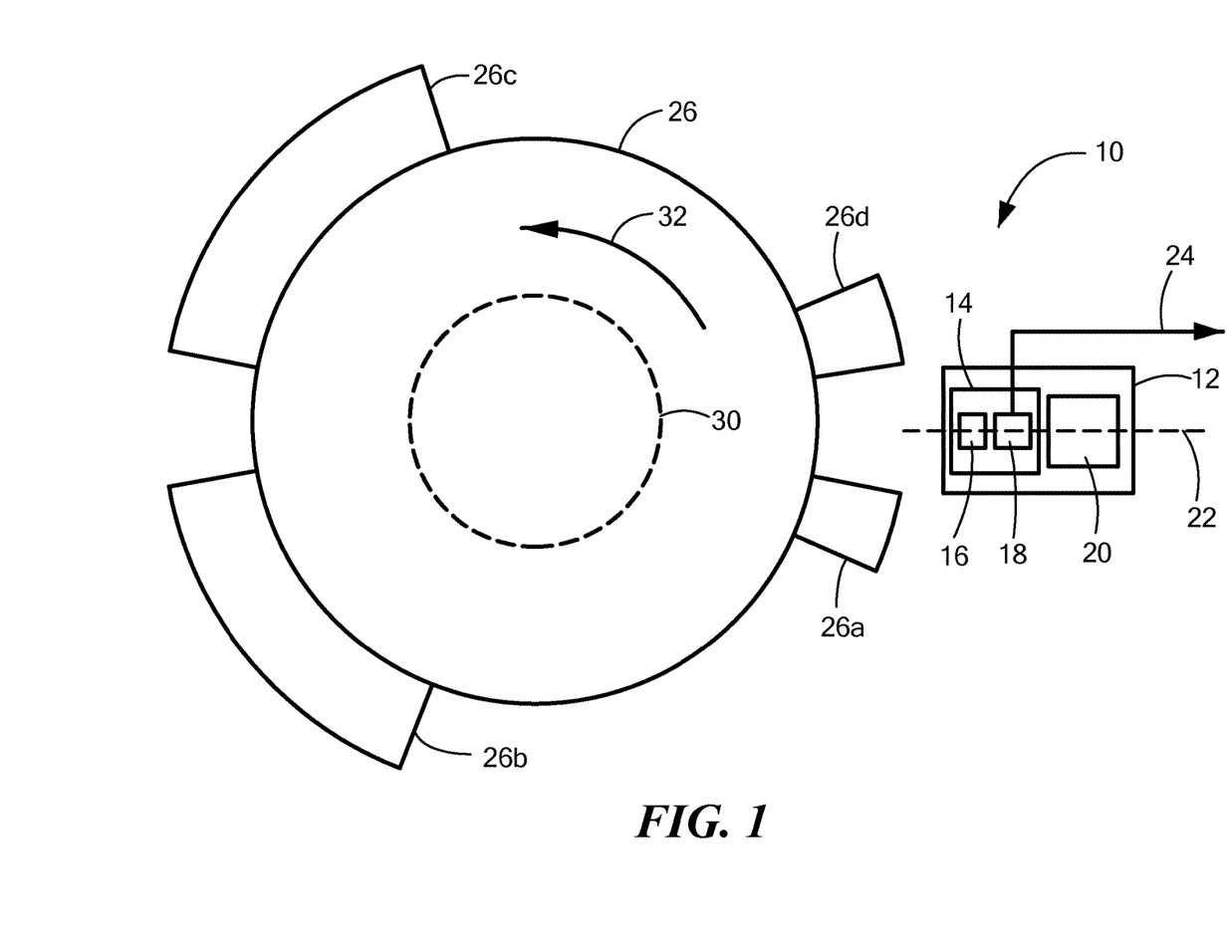
FIG. 1 is block diagram of a circuit that includes a "true power on state" (TPOS) detector.

Referring to FIG. 1, an exemplary TPOS detector arrangement 10 includes a TPOS detector 12. The TPOS detector 12 includes a magnetic field sensing circuit 14 having a magnetic field sensing element 16 (e.g., a Hall sensing element) coupled to an electronic circuit 18 (The die is not shown in the proper orientation for optimal operation, but is shown rotated for clarity of the description—typically the die would be arranged such that the surface of the die is perpendicular to the line between the magnet and the rotating target). The TPOS detector 12 also includes a magnet 20. The magnet 20 is configured to generate opposing magnetic fields parallel to an axis 22. The electronic circuit 18 is configured to generate a TPOS output signal 24.

The TPOS detector arrangement 10 can also include a TPOS target 26 having features (e.g., a feature 26a, a feature 26b, a feature 26c, a feature 26d). Each feature 26a-26d is a soft ferromagnetic object. In one example, the elements 26a-26d may be made in a hard ferromagnetic material (or a permanent magnet material) by changing the direction of the magnetization of the hard ferromagnetic material locally. In this example, the TPOS target or TPOS cam 26 may not have physical features 26a-26d but magnetic features that change the magnetic flux or magnetic field as the TPOS target 26 rotates. In one example, the features 26a-26d are gear teeth. The TPOS target 26 can be disposed, for example, upon a shaft 30 (i.e., a target object) configured to rotate in a direction 32, shown as counterclockwise but it may also rotate in the clockwise direction or be bi-directional.

Another example would be to use a non-ferromagnetic material of high conductivity (e.g., aluminum), which when rotated in the presence of a magnetic field provided by a back-biased sensor as shown in FIG. 1 the eddy current induced in the target 26 changes and therefore the magnetic flux is changed at the sensor element 14. This type of sensor may have features cut into the aluminum or high conductivity material such that the eddy current may be optimized for a given air gap or other attribute of the application.

In operation, as the TPOS target 26 rotates, the target features 26a-26d modulate the magnetic flux (also referred to herein as magnetic field) that may be sensed by the sensing element 14. Modulations of the magnetic flux generated by the magnet 20 are sensed by the magnetic field sensing element 16 and result in state transitions in the TPOS output signal 24.

Particular arrangement and spacing of the cam features 26a-26d results in the TPOS detector 12 being able to provide the TPOS output signal 24 having a state without rotation of the target or after only a small number of degrees of rotation of the TPOS target 26, which state can be interpreted by the engine control computer as an absolute angle of rotation of the TPOS target 26 and of the shaft 30 upon which the TPOS target 26 is disposed.

Figure 2:
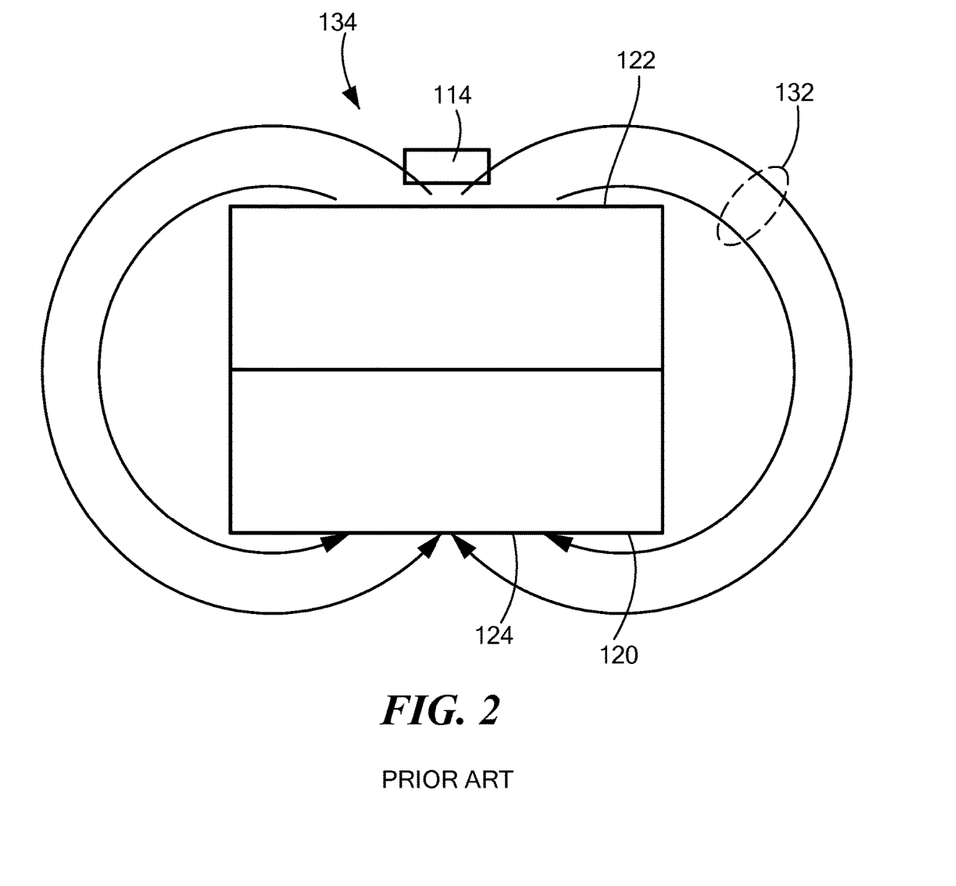
FIG. 2 is a diagram of a magnetic field detector in the prior art that includes a magnet having one North region and one South region.

Referring to FIG. 2, magnets previously used in the prior art in system 10, for example, a magnet 120, included a single North face 122 and a single South face 124 forming a magnetic field. When a target (e.g., one of the features 26a-26d) is not available to influence the magnetic field of the magnet 120, an area of maximum field magnitude 134 is formed near to and with a direction with a perpendicular component to the magnetic field sensing circuit 114 and an area of higher field activity 132 is formed on the side of the magnet 120. Typically for such a configuration the magnetic field sensing circuit 114 would have at least two planar Hall elements (magnetic field sensing elements) configured in a differential configuration. This would allow differences to be detected when one sensing element was over a tooth and the other was over a valley (between teeth) of a passing target. The location of the area of higher field activity 132 and the location of maximum field magnitude 134 do not allow for the best sensitivity of the magnetic field sensing circuit 114 to passing gear teeth for a TPOS sensor. For prior TPOS applications a core was inserted to improve the accuracy of the sensors. This core increased cost when compared to a simple magnet shown in FIG. 2.

Figure 3:
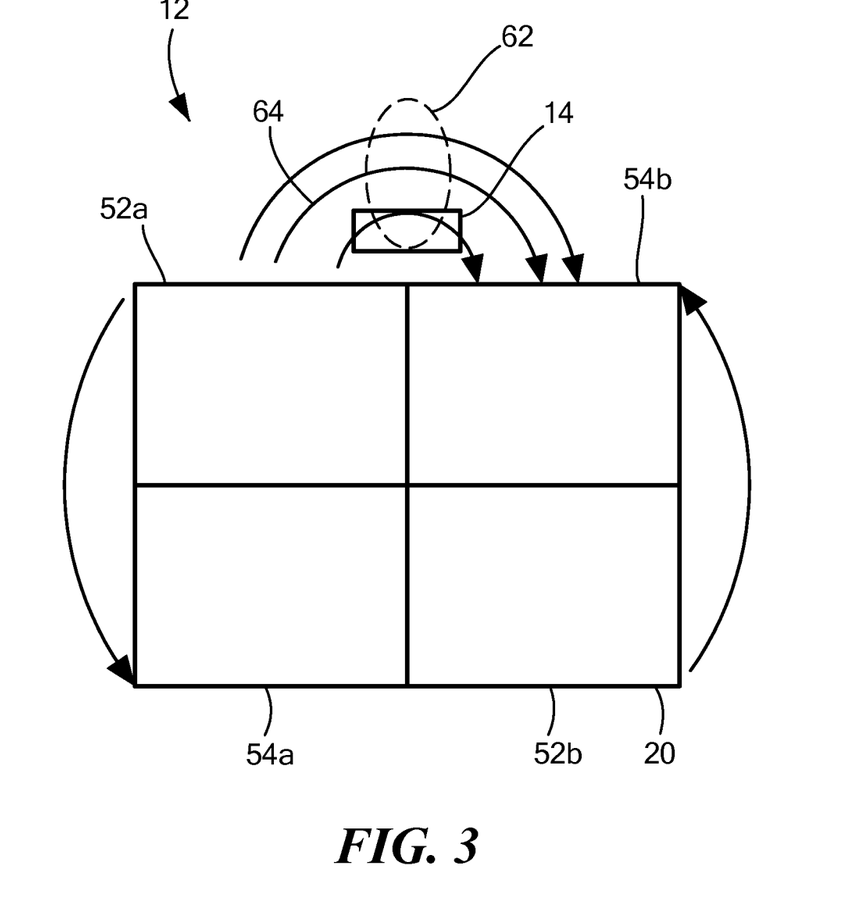
FIG. 3 is a diagram of an example of the TPOS detector of FIG. 1 that includes a magnet having two North regions and two South regions.

Referring to FIG. 3, the magnet 20 includes a first face that includes a North region 52a, and a South region 54a that provide a first magnetic field and a second face that includes a North region 52b and a South region 54b that provide a second magnetic field. As used herein the magnet 20 is a hard ferromagnetic material. When there is no target influenced by the magnet 20 a minimum magnetic field 64 is formed near to and with a direction parallel to the magnetic field sensing circuit 14. Unlike the magnet 120 (FIG. 2), an area of maximum field activity 62 is formed near the magnetic field sensing circuit 14. By having an area of maximum field activity 62 so close to the magnetic field sensing circuit 14, changes in the magnetic field by movement of the target produces a more dramatic change, for example, as shown in FIGS. 4A to 4D. Note this would be true for GMR or Hall devices, although the exact phasing or relationship between maximum response and angle of the TPOS target or TPOS cam would be slightly different due to a different axis of sensitivity of the different sensing elements. Two things are generally observed: the change in magnitude of the flux and the change in direction or angle of the flux. Both will impact the value the sensing element may detect based on the relationship of its axis of sensitivity and the absolute strength of the magnetic flux.

Figure 4A:
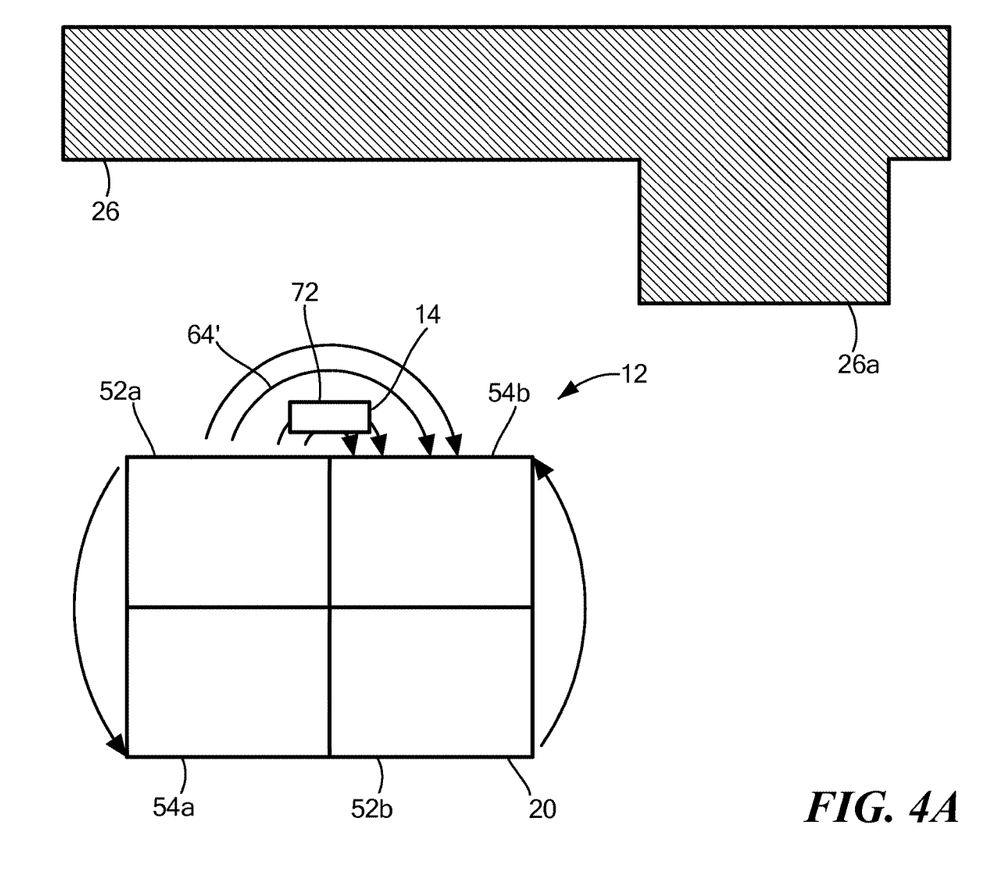
FIG. 4A is a diagram of the TPOS detector of FIG. 3 beyond a detection range of a gear tooth.

Referring to FIG. 4A, when the TPOS detector 12 is far enough away from a feature (e.g., the feature 26a) so that the feature 26a has little or in some cases negligible influence on the magnetic field 64 of the magnet 20, the primary magnetic field vectors are parallel (e.g., a primary magnetic field vector 64') with respect to a top surface 72 of the magnetic field sensing circuit 14 by going from the of region 52a to the South region 54b. If the magnetic field sensing circuit 24 includes a Hall sensing element having an axis of maximum sensitivity perpendicular to the top surface 72, parallel magnetic field vectors parallel to the top surface 72 of the magnetic field sensing circuit 14 would not be detected by the magnetic field sensing circuit 14. For GMR or AMR the sensing axis is parallel and would be a maximum for this case.

Figure 4B:
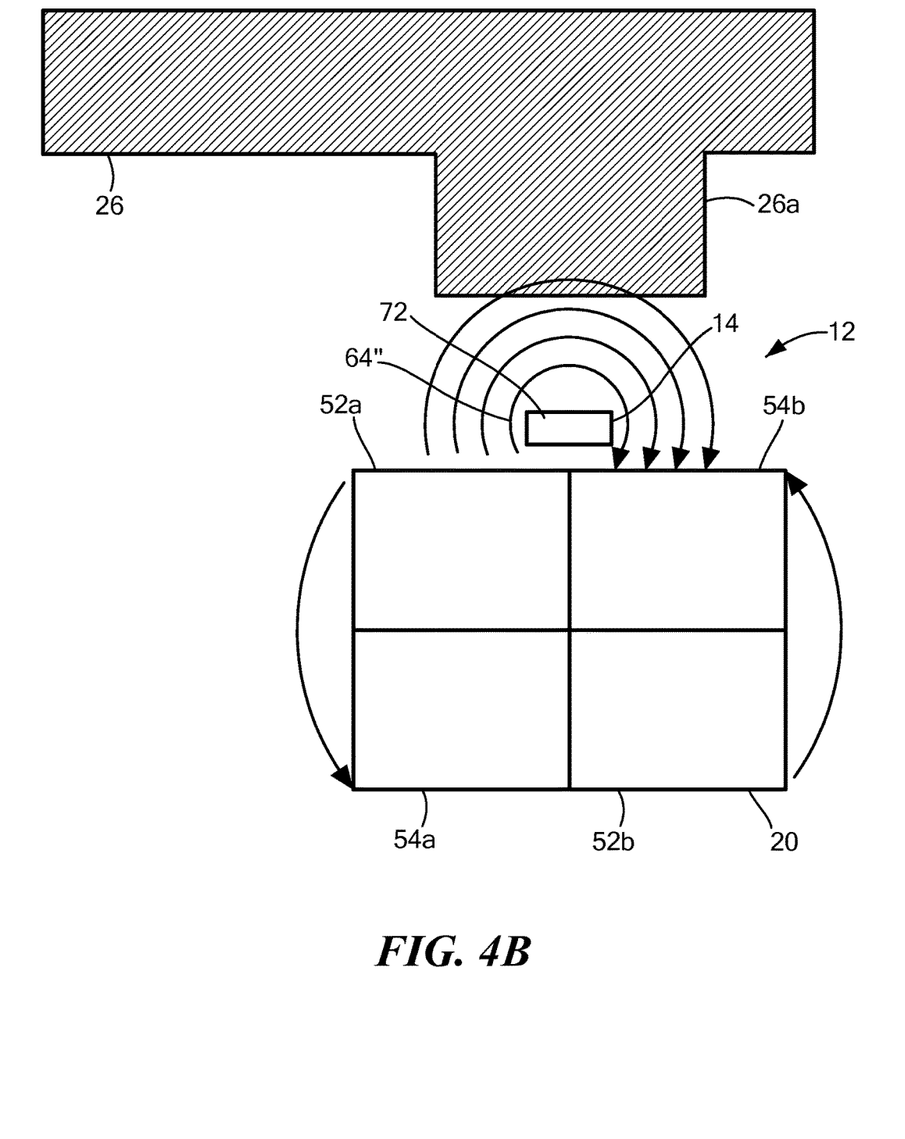
FIG. 4B is a diagram of the TPOS detector FIG. 3 and a gear tooth closest to the TPOS detector.

Referring to FIG. 4B, in one example, when the TPOS detector 12 is at its closest point to the feature 26a, the primary magnetic field vectors are for the most part or more perpendicular (e.g., a primary magnetic field vector 64) to the top surface of the magnetic field sensing circuit 14. In some cases, the vectors will pull up, but would not necessarily be perpendicular to the surface of the die 72. The exact placement of the magnet 20 and the magnetic field sensing circuit 14 for a planar Hall element embodiment would place the Hall element off the central axis (not labeled) between the North region 54a and the South region 54b. This will mean in FIG. 4A there is some measurable magnetic field, but in FIG. 4B there is more measurable magnetic field due to the increased vertical component of the field. The magnetic field will also increase in FIG. 4B compared to FIG. 4A due to the lower reluctance path taken through the soft ferromagnetic material in the feature 26a. The reason for this is that the magnetic direction seeks a lower reluctance path and goes up from the North region 52a, intersects with the feature 26a, and continues back down the path to the South region 54b. If the magnetic field sensing circuit 14 includes a Hall sensing element having an axis of maximum sensitivity perpendicular to the top surface 72, parallel magnetic field vectors perpendicular to the top surface 72 of the magnetic field sensing circuit 14 would be detected by the magnetic field sensing circuit 14.

In another embodiment a magnetic field sensing element on the die is positioned vertically with respect to the magnet 20 in a region where the magnetic flux is more parallel to the surface of the die 72. In such a case the operation would be reversed, namely that the perpendicular component of the magnetic field is larger when the feature is away from the sensing circuit 14 (as in FIG. 4A), and when the feature of the target is close to the sensing circuit 14 the perpendicular component of the magnetic field is smaller.

Figure 4C:
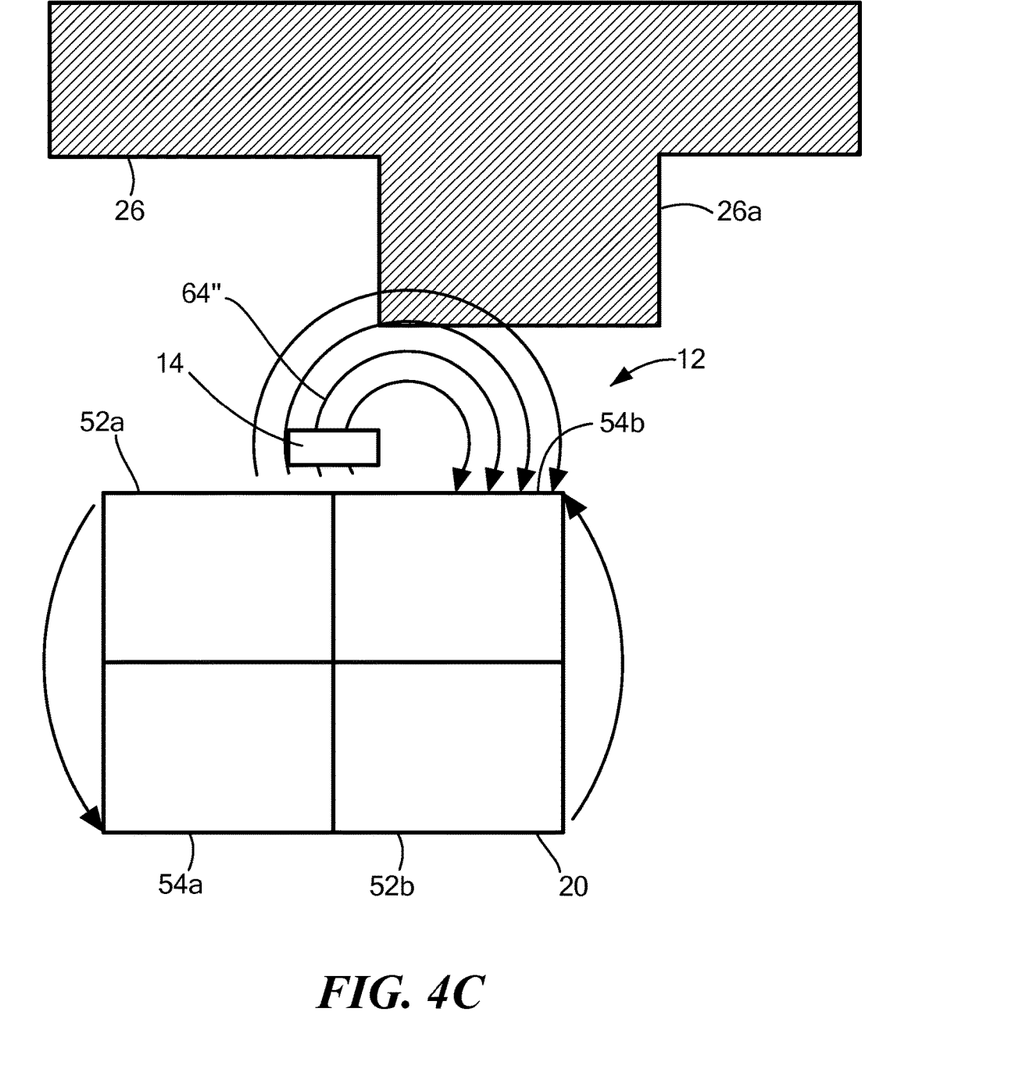
FIGS. 4C and 4D are diagrams of the TPOS detector of FIG. 3 and a gear tooth.
Figure 4D:
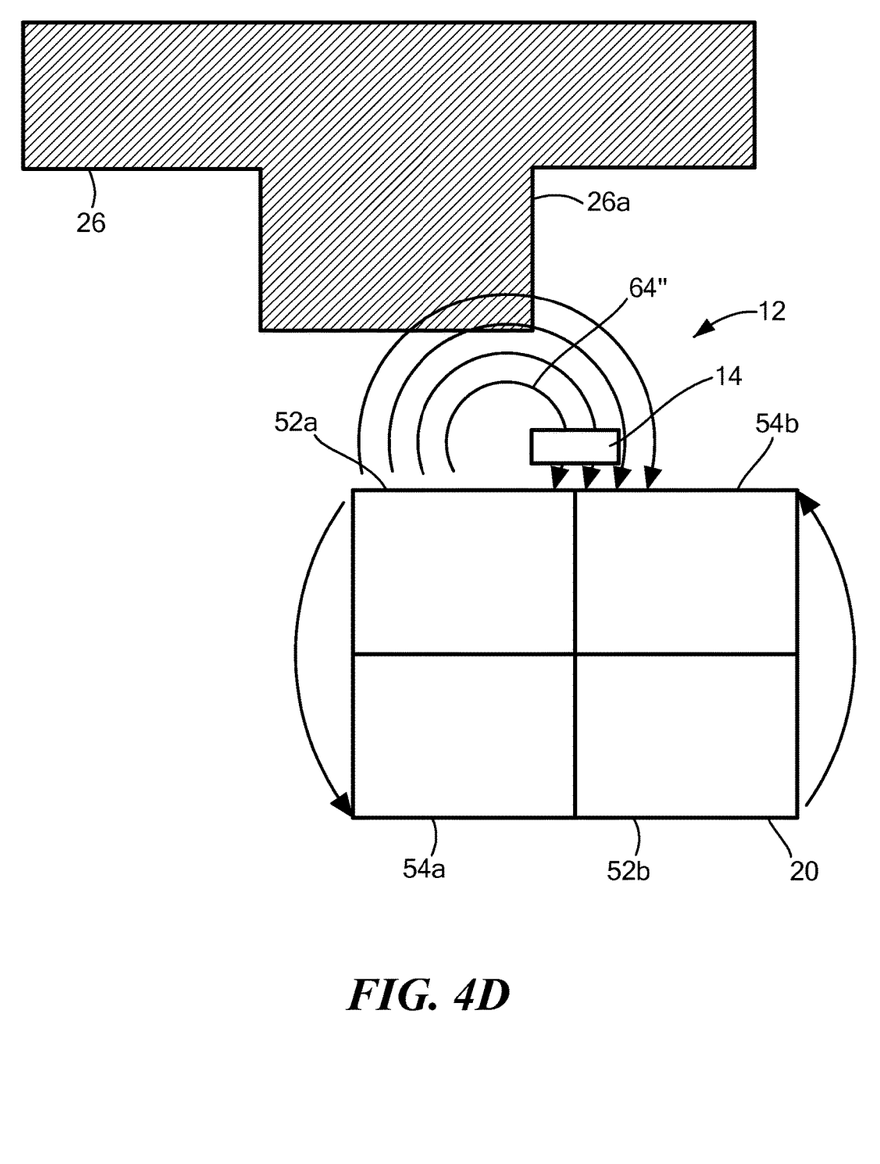

Referring to FIGS. 4C and 4D, even when the TPOS detector 12 is on the edge of the feature 26a, the primary field vectors (e.g., the primary magnetic field vector 64") include both a perpendicular and parallel component. If the magnetic field sensing circuit 14 includes a Hall sensing element having an axis of maximum sensitivity perpendicular to the top surface 72, the parallel magnetic field vectors will have components perpendicular to the top surface 72 of the magnetic field sending circuit 14, which would be detected by the magnetic field sensing circuit 14.

It would be appreciated by one of ordinary skill in the art, that the magnet 20 shown in FIG. 3 may have a number of different configuration& For example, only one face of the magnet 20 may have a North region and a South region.

Elements of different embodiments described herein may be combined to form other embodiments not specifically set forth above. Other embodiments not specifically described. herein are also within the scope of the following claims:

What is claimed is:

1. A magnetic field sensor configured to detect a position of a target object, the target object being a true power on state (TPOS) gear having features with unequal dimensions, comprising:
   one and only one magnet comprising exactly two north regions and exactly two south regions; and
   a magnetic field sensing circuit disposed proximate to the one and only magnet wherein the magnetic field sensing circuit comprises:
      a die disposed between the one and only one magnet and the target object to result in a back-biased arrangement, the die having a surface, wherein a line intersecting the one and only magnet and the target object is substantially perpendicular to and intersects the surface of the die:
      one and only one planar Hall effect element disposed upon the surface of the die wherein the one and only one planar Hall effect element has a maximum response axis substantially perpendicular to the surface of the die, wherein the one and only one planar Hall effect element experiences a magnetic field generated by the one and only one magnet; and
      an electronic circuit disposed upon the surface of the die and coupled to the one and only one planar Hall effect element, the electronic circuit operable to generate a true power on state (TPOS) output signal from the magnetic field sensor, wherein the TPOS output signal has a state indicative of an absolute angle of the target object without rotation of the target object,
   wherein the one and only one magnet is a rectangular solid and comprises a first face proximate the one and only one planar Hall effect element, and a second face opposite the first face, wherein each of the first and second faces has a respective north region and a respective south region forming a respective boundary,
   wherein the north region of the first face extends from a first edge of the first face to a second edge of the first face, opposite the first edge of the first face, and the south region of the first face extends from the first edge of the first face to the second edge of the first face,
   wherein the north region of the second face is disposed under the south region of the first face and extends from a first edge of the second face to a second edge of the second face, opposite the first edge of the second face, and the south region of the second face is disposed under the north region of the first face extends from the first edge of the second face to the second edge of the second face, wherein, when the target object is distal from the planar one and only one Hall effect element, the magnetic field experienced by the one and only one planar Hall effect element is substantially perpendicular to the maximum response axis of the one and only one planar Hall effect element, and wherein the first face and the second face have only respective outer rectangular boundaries and no inner boundaries.

2. The magnetic field sensor of claim 1 wherein the target object comprises a ferromagnetic gear having teeth and valleys, wherein the one and only one planar Hall effect element is disposed at a location that allows the magnetic field sensor to distinguish between when a center of a tooth and when a center of a valley of the target object are proximate to the planar Hall effect element when the target object is stationary.

3. The magnetic field sensor of claim 2 wherein the one and only one planar Hall effect element is disposed between the one and only one magnet and a point where the target object moves closest to the magnet.

4. The magnetic field sensor of claim I. wherein the one and only one planar Hall effect element is operable to detect changes in at least one of a magnitude or vector of the magnetic field.

5. The magnetic field sensor of claim 1 wherein the target object is comprised of a hard ferromagnetic material or a soft ferromagnetic material.

6. The magnetic field sensor of claim 1 wherein the target object comprises a magnetic object.

7. The magnetic field sensor of claim 1, wherein the first face is entirely flat and without indent.

8. The magnetic field sensor of claim 1, wherein a planar Hall effect element axis perpendicular to the first face of the magnet interests a center of the one and only one planar Hall effect element, wherein the planar Hall effect element axis is offset from a boundary between the north region and the south region of the first face of the magnet.

9. The magnetic field sensor of claim 1, wherein the target object is comprised of a non-ferromagnetic material in which an eddy current is generated in the non-ferromagnetic material in response to movement of the target object, and wherein the one and only one planar Hall effect element is also responsive to a magnetic field generated by the eddy current.

* * * * *

UNITED STATES PATENT AND TRADEMARK OFFICE
CERTIFICATE OF CORRECTION

PATENT NO. : 10,408,892 B2
APPLICATION NO. : 13/946010
DATED : September 10, 2019
INVENTOR(S) : Paul David et al.

Page 1 of 1

It is certified that error appears in the above-identified patent and that said Letters Patent is hereby corrected as shown below:

In the Specification

Column 1, Line 14 delete "in come" and replace with --in some--.

Column 1, Line 39 delete "magnetic flax" and replace with --magnetic flux--.

Column 3, Line 45-46 delete "transmission hear" and replace with --transmission gear--.

Column 4, Line 7 delete "in a" and replace with --of a--.

Column 6, Line 17 delete "configurations&" and replace with --configurations.--.

Signed and Sealed this
Seventh Day of April, 2020

Andrei Iancu
*Director of the United States Patent and Trademark Office*